US010809452B2

(12) United States Patent
Huang

(10) Patent No.: US 10,809,452 B2
(45) Date of Patent: Oct. 20, 2020

(54) MEMORY DEVICE AND ASSEMBLING METHOD THEREOF

(71) Applicant: G.Skill International Enterprise Co., Ltd., Taipei (TW)

(72) Inventor: Chiung Huang Huang, Taipei (TW)

(73) Assignee: G.SKILL INTERNATIONAL ENTERPRISE CO., LTD., Taipei (TW)

( * ) Notice: Subject to any disclaimer, the term of this patent is extended or adjusted under 35 U.S.C. 154(b) by 246 days.

(21) Appl. No.: 15/462,043

(22) Filed: Mar. 17, 2017

(65) Prior Publication Data

US 2018/0100964 A1 Apr. 12, 2018

Related U.S. Application Data

(60) Provisional application No. 62/405,407, filed on Oct. 7, 2016.

(51) Int. Cl.
*F21V 7/04* (2006.01)
*F21V 8/00* (2006.01)
(Continued)

(52) U.S. Cl.
CPC ........... *G02B 6/0085* (2013.01); *G02B 6/005* (2013.01); *G02B 6/006* (2013.01); *G02B 6/0068* (2013.01);
(Continued)

(58) Field of Classification Search
CPC .. G02B 6/0085; G02B 6/0088; G02B 6/0068; G02B 6/006; G02B 6/005; H05K 1/181;
(Continued)

(56) References Cited

U.S. PATENT DOCUMENTS 8,821,005 B2 * 9/2014 He .................. G02B 6/009
349/60
2012/0182757 A1 * 7/2012 Liang ............... G02B 6/0006
362/555

(Continued)

FOREIGN PATENT DOCUMENTS

CN 203378153 U 1/2014
TW 201606787 A 2/2016

*Primary Examiner* — William J Carter
*Assistant Examiner* — Omar Rojas Cadima
(74) *Attorney, Agent, or Firm* — WPAT, PC

(57) ABSTRACT

A memory device includes a substrate, a heat dissipation structure and a light guide element. The substrate includes a storage module, plural light-emitting elements and a connection interface. A first connection part and a second connection part of the connection interface are respectively disposed on a first substrate surface and a second substrate surface, located near a first lateral side of the substrate and electrically connected with an electronic device. The heat dissipation structure is partially connected with the substrate. The light guide element is assembled with or locked on the heat dissipation structure, and located near a second lateral side of the substrate. At least one channel is formed between the heat dissipation structure and the substrate. After the light beams of the light-emitting elements pass through the channel, the light beams are centralized or distributed on the light guide element.

8 Claims, 15 Drawing Sheets

(51) Int. Cl.
  *G11C 5/04*        (2006.01)
  *H05K 1/02*        (2006.01)
  *H05K 1/18*        (2006.01)
(52) U.S. Cl.
  CPC .............. *G02B 6/0088* (2013.01); *G11C 5/04* (2013.01); *H05K 1/0204* (2013.01); *H05K 1/0274* (2013.01); *H05K 1/181* (2013.01); *H05K 2201/066* (2013.01); *H05K 2201/10106* (2013.01); *H05K 2201/10159* (2013.01)
(58) Field of Classification Search
  CPC .............. H05K 1/0204; H05K 1/0274; H05K 2201/10106; H05K 2201/066; H05K 2201/1015; G11C 5/04
  See application file for complete search history.

(56) References Cited

U.S. PATENT DOCUMENTS

| | | | |
|---|---|---|---|
| 2014/0152550 A1* | 6/2014 | Beall ................ | G06F 3/012 345/156 |
| 2018/0128474 A1* | 5/2018 | Bizzotto ............ | F21V 29/76 |

\* cited by examiner

MEMORY DEVICE AND ASSEMBLING METHOD THEREOF

CROSS-REFERENCE TO RELATED APPLICATION

This application claims priority to U.S. Provisional Patent Application No. 62/405,407 filed Oct. 7, 2016, the contents of which are incorporated herein by reference.

FIELD OF THE INVENTION

The present invention relates to a memory device, and more particularly to a memory device having the function of assembling a replaceable light guide element with a heat dissipation structure.

BACKGROUND OF THE INVENTION

As the performance of electronic products gradually increases, various memory devices are applied to the electronic products. For example, the existing dynamic random access memory device for an electronic sports product has many extensive components. For meeting the acousto-optical demand, the dynamic random access memory device comprises plural function modules (e.g., a storage module and a control module), plural light emitting diodes, a thermal adhesive pad, a heat dissipation structure, a light guide element, and so on.

FIG. 1A is a schematic perspective view illustrating a conventional memory device. FIG. 1B is a schematic side cross-sectional view of the conventional memory device of FIG. 1A. For example, the conventional memory device is a dynamic random access memory device for an electronic sports product. As shown in FIGS. 1A and 1B, the memory device 10 comprises plural light emitting diodes 112. The plural light emitting diodes 11 are uniformly distributed on a substrate 11 of the memory device 10. Under control of a controlling circuit 113, these light emitting diodes 112 emit light beams at a different frequency in order to notify the user whether the memory device is overheated or not.

As shown in FIGS. 1A and 1B, the light emitting diodes 112 are located at the top edge of the substrate 11, and a light guide element 15 is disposed on the top edge of the substrate 11 to cover the light emitting diodes 112. Since the light emitting diodes 112 are covered by the light guide element 15, the heat generated by the light emitting diodes 112 cannot be dissipated away easily. Under this circumstance, the temperature of the overall memory device 10 increases.

As shown in the drawings, the memory device 10 further comprises a heat dissipation structure 131. The heat dissipation structure 131 has a light-shading function. Moreover, the heat dissipation structure 131 is arranged around the light guide element 15. The heat dissipation structure 131 comprises plural light-transmissible regions 14. The light beams emitted by the light emitting diodes 112 are outputted from the light guide element 15 through the light-transmissible regions 14. Consequently, the light beams are uniformly distributed and become softer. Since the lighting positions of the light beams are limited by these light-transmissible regions 14, the optical path of the overall memory device 10 is limited by these light-transmissible regions 14. That is, the light beams can be outputted through the positions of these light-transmissible regions 14.

A process of assembling the conventional memory device 10 will be described as follows. Firstly, the light emitting diodes 112 at the top edge of the substrate 11 are covered and surrounded by the light guide element 15. Then, the light guide element 15 and the substrate 11 are surrounded and clamped by the heat dissipation structure 131. Consequently, the light guide element 15 and the substrate 11 are combined together and fixed by the heat dissipation structure 131. As mentioned above, the memory device using this assembling process still has the above drawbacks. For example, the heat generated by the light emitting diodes 112 cannot be dissipated away easily. Moreover, since the light guide element 15 is surrounded and clamped by the heat dissipation structure 131, the light beams emitted by the light emitting diodes 112 are restricted.

Therefore, it is important to efficiently increase the heat dissipating performance of the overall memory device and provide an improve design of guiding the light beams of the light emitting diodes.

SUMMARY OF THE INVENTION

For solving the drawbacks of the conventional technologies, the present invention provides a memory device and an assembling method in order to effectively increase the heat dissipating performance of the memory device.

For solving the drawbacks of the conventional technologies, the present invention provides a memory device and an assembling method in order to effectively enhance the overall lighting effect of the memory device.

In accordance with an aspect of the present invention, there is provided a memory device. The memory device includes a substrate, a heat dissipation structure and a light guide element. The substrate includes a storage module, plural light-emitting elements and a connection interface. The connection interface includes a first connection part and a second connection part. The first connection part and the second connection part are respectively disposed on a first substrate surface and a second substrate surface of the substrate. The first connection part and the second connection part are located near a first lateral side of the substrate and electrically connected with an electronic device. The heat dissipation structure is partially connected with the substrate. The light guide element is assembled with or locked on the heat dissipation structure. The light guide element is located near a second lateral side of the substrate. The second lateral side is opposed to the first lateral side. At least one channel is formed between the heat dissipation structure and the substrate. After light beams generated by the plural light-emitting elements pass through the at least one channel, the light beams are centralized or distributed on the light guide element.

In an embodiment, the heat dissipation structure includes a first part and a second part. The first part is attached on the substrate. The second part is located near the second lateral side of the substrate. The light guide element is assembled with or locked on the second part.

In an embodiment, the second part further includes a fin assembly and at least one position-limiting recess. The fin assembly includes plural fins. The plural fins are arranged side by side. The at least one position-limiting recess is defined by outer rims of the plural fins.

In an embodiment, the light guide element further includes a locking part and at least one positioning part corresponding to the fin assembly and the at least one position-limiting recess. The at least one positioning part is limited within the at least one position-limiting recess. The locking part is assembled with the second part of the heat dissipation structure, or the locking part is fixed between the plural fins.

In an embodiment, there are plural seams between the plural fins, and the plural light beams from the substrate are centralized or distributed on the light guide element through the plural seams.

In an embodiment, the light guide element generates at least one lighting effect according to locations of the plural seams.

In an embodiment, the light guide element further includes plural light guide surfaces, and at least one of the plural light guide surfaces includes a light-shading layer. The light-shading layer includes a shading region, and the plural light beams are blocked from passing through the shading region.

In an embodiment, the light-shading layer further includes a non-shading region, and the plural light beams are centralized or distributed on the non-shading region.

In an embodiment, the memory device further includes a thermal adhesive pad, and the heat dissipation structure is partially attached on the substrate through the thermal adhesive pad.

In an embodiment, the plural light-emitting elements are RGB LEDs, which are controlled by an application program.

In an embodiment, the application program is loaded into a control module of the substrate and/or a host that is electrically connected with the memory device, so that the RGB LEDs produce monochromatic or polychromatic lighting effects.

In accordance with another aspect of the present invention, there is provided a memory device. The memory device includes a substrate, at least one heat dissipation structure and a light guide element. The substrate at least includes a storage module, plural light-emitting elements and a connection interface. The substrate has a first substrate surface, a second substrate surface, a first lateral side and a second lateral side. The second lateral side is opposed to the first lateral side. The first lateral side and the second lateral side are arranged between the first substrate surface and the second substrate surface. A first connection part of the connection interface is disposed on the first substrate surface. A second connection part of the connection interface is disposed on the second substrate surface. The first connection part and the second connection part are located near the first lateral side of the substrate and electrically connected with an electronic device. The at least one heat dissipation structure is disposed on the first substrate surface and/or the second substrate surface. The light guide element is assembled with or locked on the at least one heat dissipation structure, and located near the second lateral side of the substrate. Moreover, at least one channel is formed between the at least one heat dissipation structure and the substrate. After light beams generated by the plural light-emitting elements pass through the at least one channel, the light beams are centralized or distributed on the light guide element.

In an embodiment, the at least one heat dissipation structure includes a first heat dissipation structure and a second heat dissipation structure. A first part of the first heat dissipation structure and a first part of the second heat dissipation structure are respectively attached on the first substrate surface and the second substrate surface. A second part of the first heat dissipation structure and a second part of the second heat dissipation structure are located near the second lateral side of the substrate. The light guide element is assembled with or locked on the second part of the first heat dissipation structure and the second part of the second heat dissipation structure.

In an embodiment, each of the second part of the first heat dissipation structure and the second part of the second heat dissipation structure includes plural seams, and the plural light beams from the substrate are centralized or distributed on the light guide element through the plural seams.

In an embodiment, the memory device further includes two thermal adhesive pads, and the first heat dissipation structure and the second heat dissipation structure are partially attached on the first substrate surface and the second substrate surface through the two thermal adhesive pads, respectively.

In accordance with another aspect of the present invention, there is provided a method for assembling a memory device. The method at least includes the following steps. In a step (A), a substrate, at least one heat dissipation structure and a light guide element are provided. The substrate includes a first substrate surface, a second substrate surface, a first lateral side, a second lateral side and a connection interface. The second lateral side is opposed to the first lateral side. The first lateral side and the second lateral side are arranged between the first substrate surface and the second substrate surface. A first connection part of the connection interface is disposed on the first substrate surface. A second connection part of the connection interface is disposed on the second substrate surface. The first connection part and the second connection part are located near the first lateral side of the substrate and electrically connected with an electronic device. In a step (B), the substrate is partially connected with the at least one heat dissipation structure. In a step (C), the light guide element is assembled with or locked on the at least one heat dissipation structure and located near the second lateral surface of the substrate.

In an embodiment, the at least one heat dissipation structure includes a first heat dissipation structure and a second heat dissipation structure. The first heat dissipation structure is attached on the first substrate surface. The second heat dissipation structure is attached on the second substrate surface.

In an embodiment, a first part of the first heat dissipation structure is attached on the first substrate surface, a first part of the second heat dissipation structure is attached on the second substrate surface, and a second part of the first heat dissipation structure and a second part of the second heat dissipation structure are located near the second lateral side of the substrate.

In an embodiment, the method further includes a step of partially attaching the first heat dissipation structure and the second heat dissipation structure on the first substrate surface and the second substrate surface through two thermal adhesive pads, respectively.

In accordance with another aspect of the present invention, there is provided a method for assembling a memory device. The method at least includes the following steps. In a step (A), a substrate, at least one heat dissipation structure and a light guide element are provided. The substrate includes a first substrate surface, a second substrate surface, a first lateral side, a second lateral side and a connection interface. The second lateral side is opposed to the first lateral side. The first lateral side and the second lateral side are arranged between the first substrate surface and the second substrate surface. A first connection part of the connection interface is disposed on the first substrate surface. A second connection part of the connection interface is disposed on the second substrate surface. The first connection part and the second connection part are located near the first lateral side of the substrate and electrically connected with an electronic device. In a step (B), the light guide element is assembled with or locked on the at least one heat dissipation structure. In a step (C), the at least one heat dissipation structure is partially connect or clamp the first substrate surface and the second substrate surface. The light guide element is located near the second lateral side of the substrate.

In an embodiment, the at least one heat dissipation structure includes a first heat dissipation structure and a second heat dissipation structure. The first heat dissipation structure is attached on the first substrate surface. The second heat dissipation structure is attached on the second substrate surface.

In an embodiment, a first part of the first heat dissipation structure is attached on the first substrate surface, a first part of the second heat dissipation structure is attached on the second substrate surface, and a second part of the first heat dissipation structure and a second part of the second heat dissipation structure are located near the second lateral side of the substrate.

In an embodiment, each of the second part of the first heat dissipation structure and the second part of the second heat dissipation structure includes plural seams, and the plural light beams from the substrate are centralized or distributed on the light guide element through the plural seams.

In an embodiment, the method further includes a step of partially attaching the first heat dissipation structure and the second heat dissipation structure on the first substrate surface and the second substrate surface through two thermal adhesive pads, respectively.

From the above descriptions, the shapes and locations of the components of the memory device are specially designed. Especially, the heat dissipation structure and the location of the light guide element are specially designed. Consequently, the heat dissipating performance of the memory device is effectively enhanced. Moreover, the shape of the heat dissipation structure is designed to change the guiding path of the light beams of the light-emitting elements in the heat dissipation structure. Consequently, the refracted position of the light beams in the light guide element and the luminance of the light beams are adjusted. Consequently, the overall lighting effect of the memory device is enhanced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention provides a memory device. The structures and shapes of the heat dissipation structure and the light guide element of the memory device are improved. Moreover, the locations of the heat dissipation structure and the light guide element are changed. The concepts of the present invention will now be described more specifically with reference to the following embodiments. It is to be noted that the following descriptions of preferred embodiments of this invention are presented herein for purpose of illustration and description only.

Figure 2A:
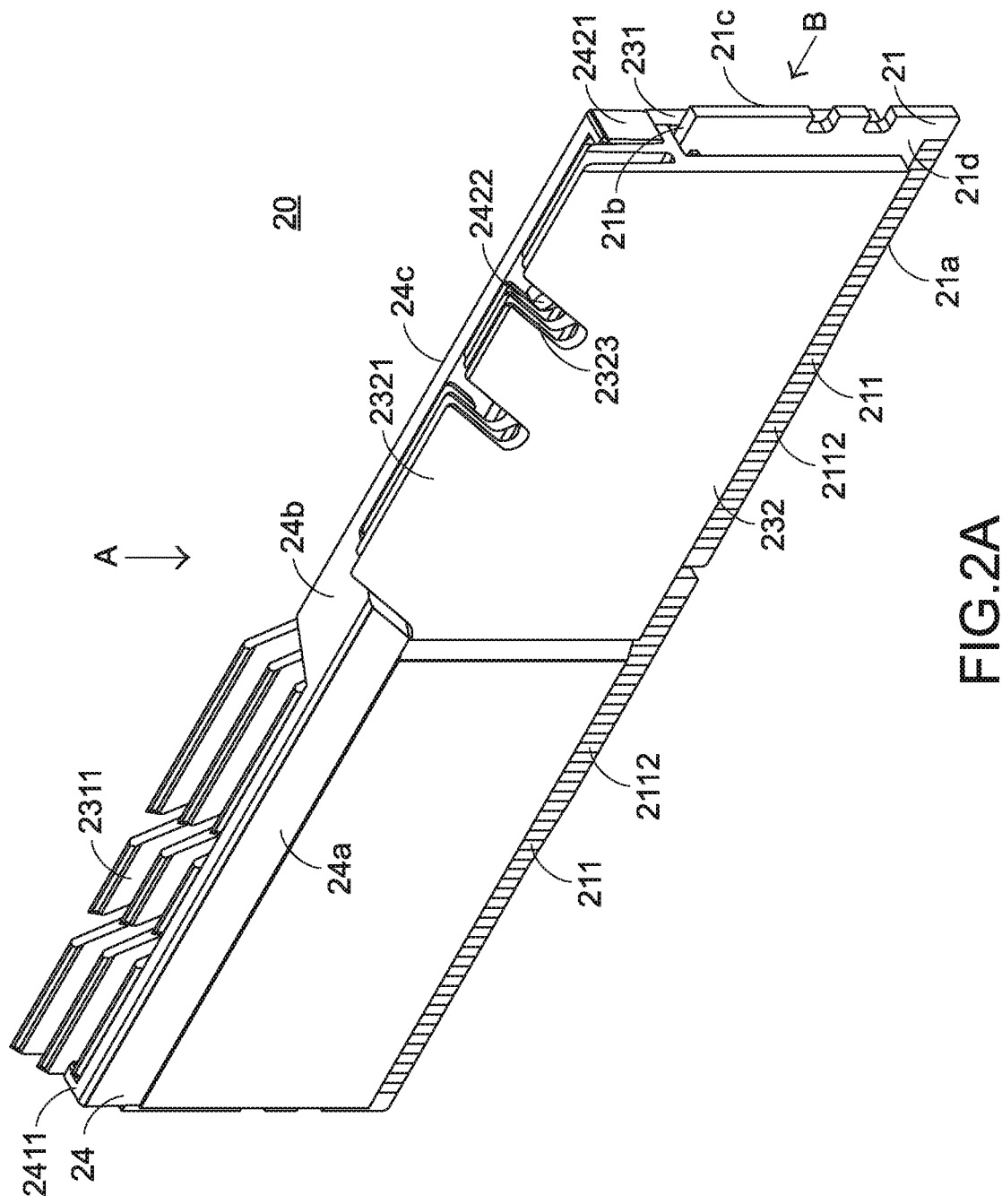
FIG. 2A is a schematic perspective view illustrating a memory device according to a first embodiment of the present invention.
Figure 2B:
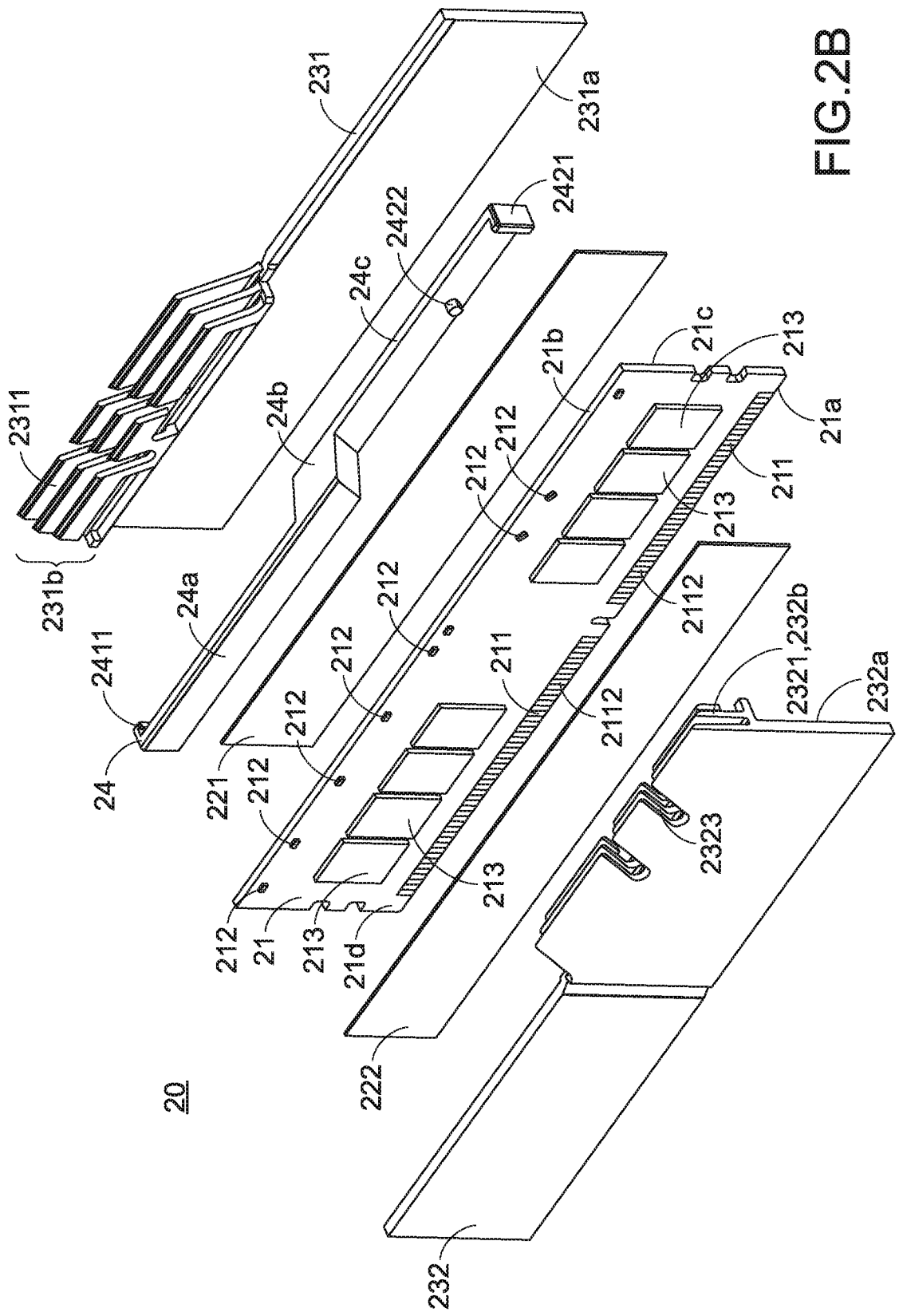
FIG. 2B is a schematic exploded view illustrating the memory device of FIG. 2A.

FIG. 2A is a schematic perspective view illustrating a memory device according to a first embodiment of the present invention. FIG. 2B is a schematic exploded view illustrating the memory device of FIG. 2A.

As shown in FIGS. 2A and 2B, the memory device 20 of the first embodiment comprises a substrate 21, a first thermal adhesive pad 221, a second thermal adhesive pad 222, a first heat dissipation structure 231, a second heat dissipation structure 232 and a light guide element 24. The substrate 21 comprises a first lateral side 21a, a second lateral side 21b, a first substrate surface 21c, a second substrate surface 21d, a connection interface 211, plural light-emitting elements 212 and plural function modules 213. The connection interface 211 comprises a first connection part 2111 and a second connection part 2112 (see FIG. 2D). The first heat dissipation structure 231 comprises a first part 231a and a second part 231b. Similarly, the second heat dissipation structure 232 comprises a first part 232a and a second part 232b. The first parts 231a and 232a are attached on the substrate surfaces 21c and 21d, respectively. The second parts 231b and 232b are located near the second lateral side 21b of the substrate 21. In this embodiment, the second parts 231b and 232b comprise fin assemblies 2311 and 2321, respectively. The light guide element 24 further comprises a first locking part 2411, a second locking part 2421 and a positioning part 2422. Moreover, the first lateral side 21a and second lateral side 21b of the substrate 21 are arranged between the two substrate surfaces 21c and 21d.

The connecting relationships between the above components will be described as follows. A first surface of the first thermal adhesive pad 221 is attached on the second substrate surface 21d of the substrate 21. Similarly, a first surface of the second thermal adhesive pad 222 is attached on the first substrate surface 21c of the substrate 21. The first heat dissipation structure 231 is partially attached on a second surface of the first thermal adhesive pad 221. Similarly, the second heat dissipation structure 232 is partially attached on a second surface of the second thermal adhesive pad 222. Next, the first locking part 2411, the second locking part 2421 and the positioning part 2422 of the light guide element 24 are engaged with the fin assemblies 2311 and 2321. Consequently, the light guide element 24 is locked and fixed on the top edges of the heat dissipation structures 231 and 232.

Especially, the first connection part 2111 and the second connection part 2112 of the connection interface 211 are disposed on the first substrate surface 21c and the second substrate surface 21d, respectively. Moreover, the first connection part 2111 and the second connection part 2112 of the connection interface 211 are located near the first lateral side 21a and electrically connected with an electronic device (not shown). The two heat dissipation structures 231 and 232 are located near the two substrate surfaces 21c and 21d through the two thermal adhesive pads 221 and 222, respectively. The light guide element 24 is assembled with or locked on the two heat dissipation structures 231 and 232. Moreover, the light guide element 24 is located near the second lateral side 21b of the substrate 21.

Moreover, there is at least one channel between the two heat dissipation structures 231, 232 and the substrate 21. After the light beams generated by the plural light-emitting elements 212 pass through the at least one channel, the light beams are centralized or distributed on the light guide element 24. The channel is a gap (not shown) that is created when the substrate 21 is clamped between and partially connected with the two heat dissipation structures 231 and 232.

As mentioned above, the substrate 21 is electrically connected with an electronic device (not shown) through the first connection part 2111 and the second connection part 2112 of the connection interface 211. The plural function modules 213 at least comprise a control module and several storage modules. The control module is used for controlling the lighting frequency and the luminance of the plural light-emitting elements 212. In addition, the control module can read data from the storage modules or write data into the storage modules.

For example, the light-emitting elements 212 are three-primary color light emitting diodes (RGB LEDs). These RGB LEDs are controlled by a control module 213 (e.g., a MCU control chip) when an application program (e.g., software or firmware) is executed. Since the colors of the light beams from these light-emitting elements 212 are adjustable, various lighting effects are produced.

In other words, the control module 213 can control the lighting frequency and the luminance of the RGB LEDs. For example, the control module 213 can control the intensity of monochromatic or polychromatic light beams. According to the settings of the application program, the light beams provide diversified color changes of a single color or multiple colors in a specified time interval. For example, the color changes include a gradient color change, a lightning color change or a flowing color change.

Moreover, the two thermal adhesive pads 221 and 222 can assist in transferring the heat from the substrate 21 to the two heat dissipation structures 231 and 232. Consequently, the heat transfer efficiency and the heat dissipating performance of the overall memory device 20 are enhanced.

It is noted that those skilled in the art may modify the types and applications of the above components while retaining the teachings of the invention. For example, the fin assemblies 2311 and 2321 may have a rectangular shape, an arc shape, a fan shape or an irregular shape. Moreover, the heat dissipation structure 232 further comprises a position-limiting hole or a position-limiting recess 2323 corresponding to the positioning part 2422. The numbers and profiles of the heat dissipation structures 231 and 232 are not restricted. That is, the numbers and profiles of the heat dissipation structures 231 and 232 may be varied according to the applications, practical requirements and aesthetic designs of the product.

Figure 2C:
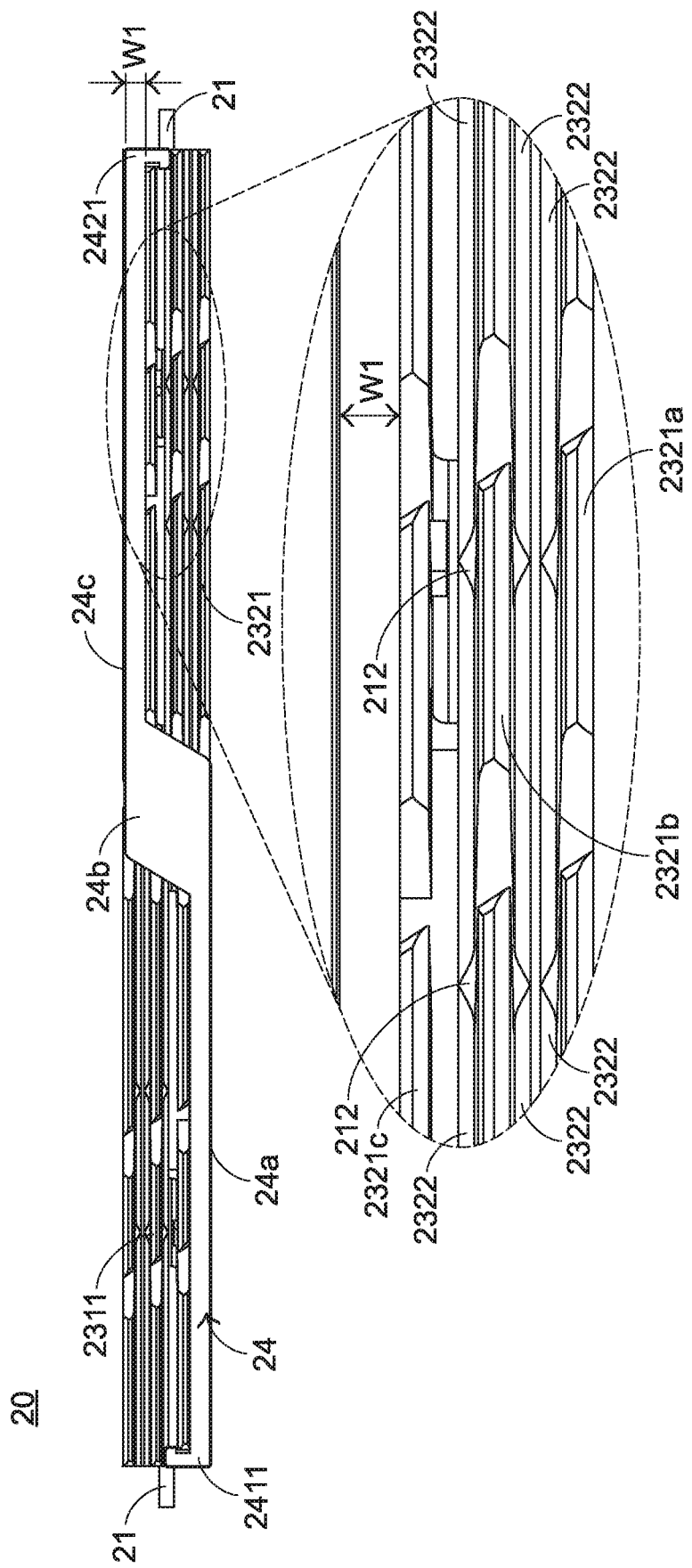
FIG. 2C is a schematic top view illustrating the memory device of FIG. 2A and taken along a viewpoint A.

In accordance with the present invention, the fin assembly 2311 of the first heat dissipation structure 231, the fin assembly 2321 of the second heat dissipation structure 232 and the light guide element 24 are specially designed. FIG. 2C is a schematic top view illustrating the memory device of FIG. 2A and taken along a viewpoint A. The special designs of these components will be described with reference to FIG. 2C as follows.

The fin assembly 2321 of the second heat dissipation structure 232 will be described as follows. As shown in FIG. 2C, the fin assembly 2321 of the second heat dissipation structure 232 comprises plural fins 2321a~2321c. These fins 2321a~2321c can increase the heat dissipating performance of the overall memory device 20. Moreover, there are plural seams 2322 between these fins 2321a~2321c. After the light beams emitted by the light-emitting elements 212 pass through the seams 2322, the light beams are outputted along a refractive guiding path. Moreover, as mentioned above, the light beams are centralized or distributed on the light guide element 24 after passing through the at least one channel. In other words, the way of guiding the light beams is not restricted.

According to the light refraction and the seams 2322 of the fin assembly 2321 or the at least one channel (not shown), the guiding path for the light beams of the light-emitting elements 212 is designed. Since the light beams are transferred through the guiding path, the light guide element 24 provides novel and aesthetically-pleasing lighting effects.

In addition to the two locking parts 2411, 2421 and the positioning part 2422, the light guide element 24 further comprises three light guide surfaces 24a~24c. In the top view of FIG. 2C, the light guide surface 24a is on a left side of the fin assembly 2311, the light guide surface 24b is disposed over the memory device 20, and the light guide surface 24c is on the right side of the fin assembly 2321. Due to the seams of the first heat dissipation structure 231 and the seams 2322 of the second heat dissipation structure 232, the light beams are transferred through the designed guiding path and centralized or distributed on the three light guide surfaces 24a~24c.

It is noted that those skilled in the art may modify the shape, material and application of the light guide element 24 while retaining the teachings of the invention. That is, the shape, material and application of the light guide element 24 may be varied according to the applications and practical requirements of the light guide element and the memory device.

As mentioned above, after the light beams from the light-emitting elements 212 pass through the seams 2322, the light beams are transferred along the guiding path and the light beams corresponding to the guiding path are refracted by the light guide element 24. Moreover, since the light-emitting elements 212 are not covered by the light guide element 24, the drawbacks of the conventional technology can be overcome.

In accordance with the feature of the present invention, the light guide element 24 is detachably assembled with the heat dissipation structures 231 and 232. Moreover, due to the seams 2322 of the fin assemblies 211 and 2312, the guiding path of the light beams is designed. Consequently, the light guide element 24 that does not cover the light-emitting elements 212 can provide special and aesthetically-pleasing lighting effects. For example, in an embodiment, the light beams are centralized to a specified site of the light guide element 24 (e.g., the LOGO site). Some implementation examples of the light guide element 24 will be described in more details as follows.

Figure 2D:
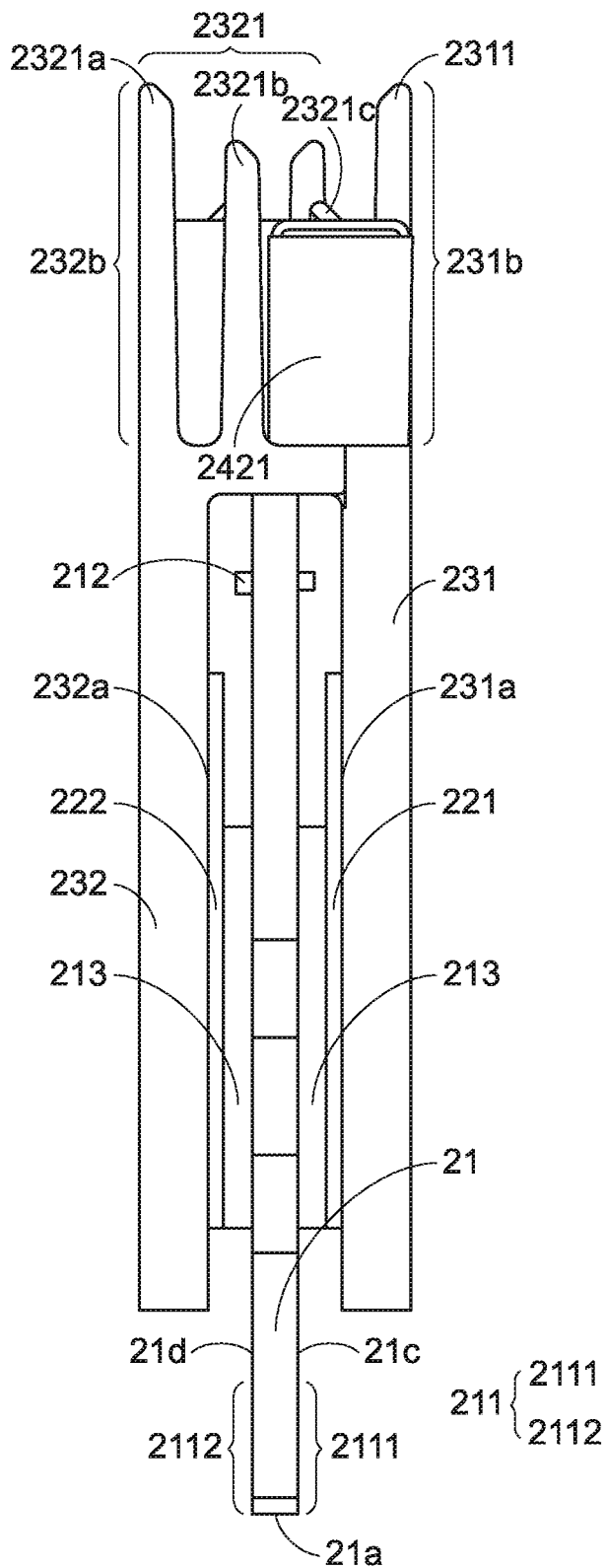
FIG. 2D is a schematic side view illustrating the memory device of FIG. 2A and taken along a viewpoint B.

FIG. 2D is a schematic side view illustrating the memory device of FIG. 2A and taken along a viewpoint B. As shown in FIG. 2D, the substrate 21 is arranged between the two symmetric thermal adhesive pads 221 and 222 and between the two heat dissipation structures 231 and 232. Moreover, the two heat dissipation structures 231 and 232 are partially and firmly attached on the substrate 21 through the thermal adhesive pads 221 and 222. Consequently, heat transfer efficiency and the heat dissipating performance of the overall memory device 20 are enhanced.

Moreover, as shown in FIG. 2D, the light-emitting elements 212 are disposed on the first substrate surface 21c and the second substrate surface 21d. The second lateral side 21b of the substrate 21 is located near the fin assemblies 2311 and 2321 of the two heat dissipation structures 231 and 232. When the airflow flows through the fins of the fin assembly 2311 and the fins 2321a~2321c of the fin assembly 2321, the heat energy of the memory device 20 is dissipated away by the airflow. Consequently, the heat dissipating performance of the overall memory device is enhanced.

Since the light guide element 24 is locked and fixed on the fin assemblies 2311 and 2321 through the two locking parts 2411 and 2421, the light guide element 24 is locked and fixed on the heat dissipation structures 231 and 232. The fin assemblies 2321 and 2321 further comprise the position-limiting recesses (e.g., the position-limiting recess 2323) corresponding to the positioning part 2422 of the light guide element 24.

Please refer to FIGS. 2A~2D again. In this embodiment, the light guide element 24 is an S-shaped structure. Moreover, the two locking parts 2411 and 2421 are respectively located at two distal ends of the S-shaped structure. The positioning part 2422 of the light guide element 24 is engaged with the position-limiting recess 2323 of the fin assembly 2321. Consequently, the relative positions between the light guide element 24 and the two heat dissipation structures 231 and 232 are confined.

The engagement between the fin assembly 2321 and the second locking part 2421 will be described as follows. In an embodiment, the second locking part 2421 of the light guide element 24 has a hook. The second locking part 2421 is engaged with the fin 2321c of the fin assembly 2321 through the hook. Consequently, the light guide element 24 is fixed on the two heat dissipation structures 231 and 232, and the relative positions between the light guide element 24 and the two heat dissipation structures 231 and 232 are confined.

Figure 3A:
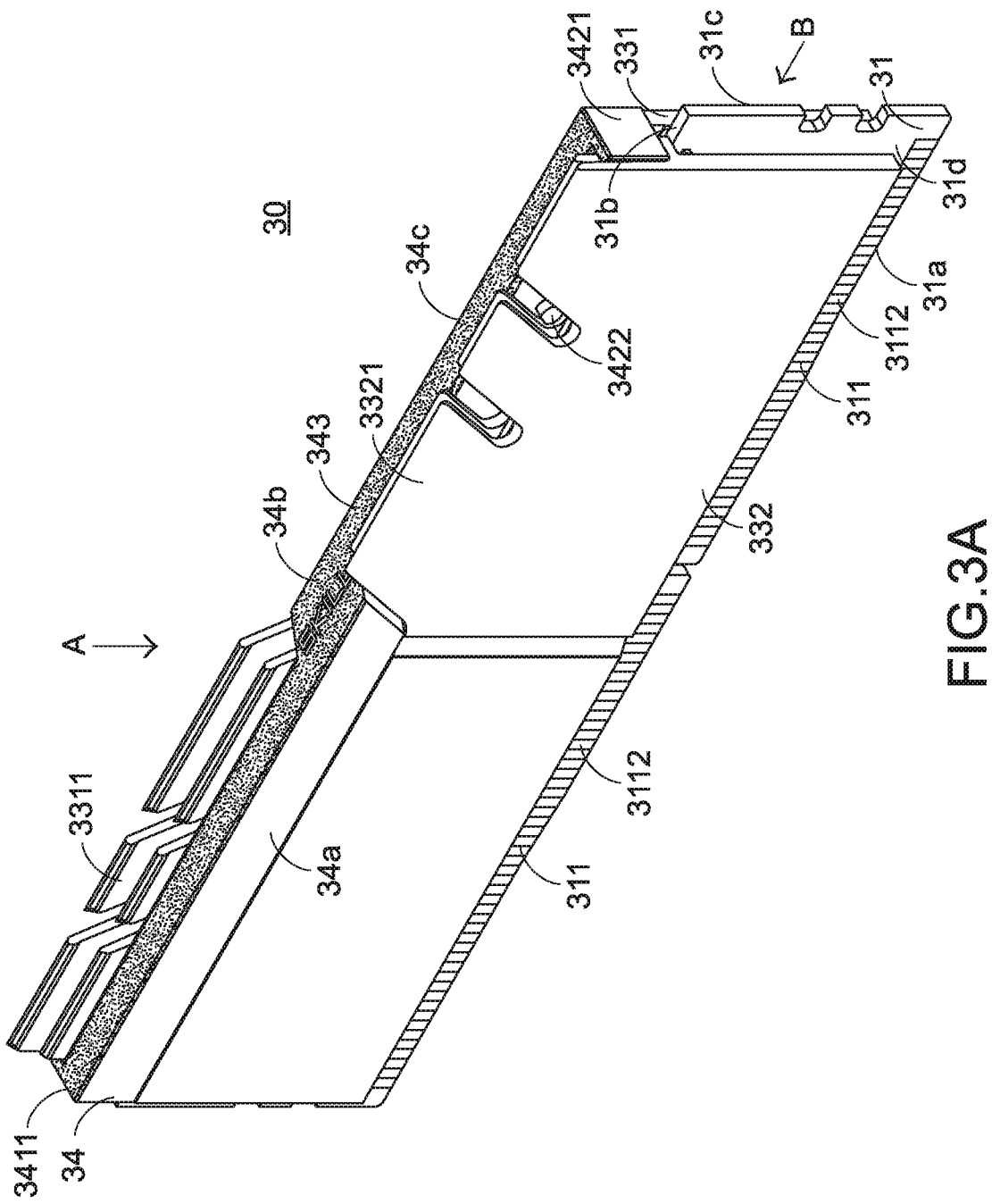
FIG. 3A is a schematic perspective view illustrating a memory device according to a second embodiment of the present invention.
Figure 3B:
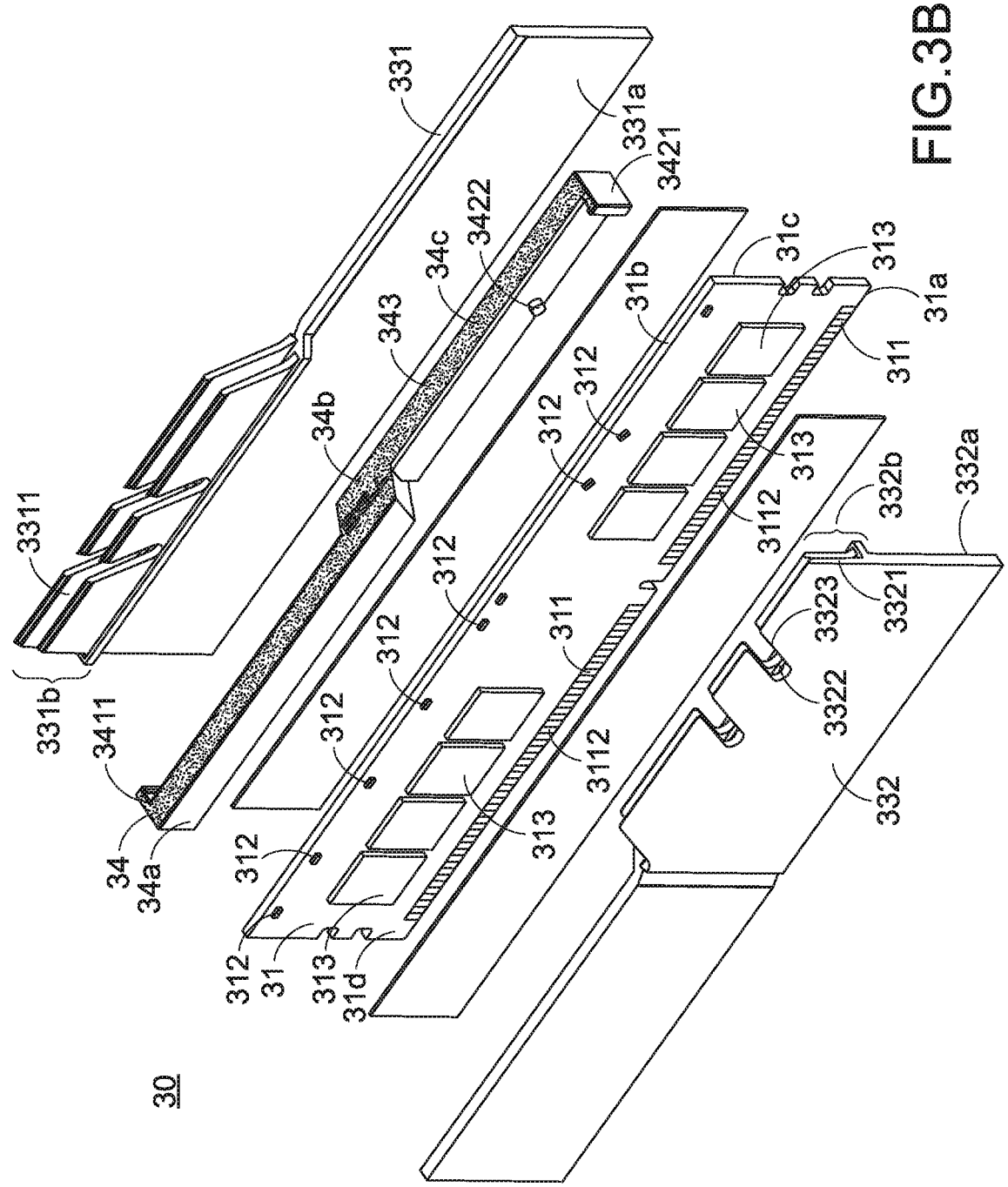
FIG. 3B is a schematic exploded view illustrating the memory device of FIG. 3A.

FIG. 3A is a schematic perspective view illustrating a memory device according to a second embodiment of the present invention. FIG. 3B is a schematic exploded view illustrating the memory device of FIG. 3A.

As shown in FIGS. 3A and 3B, the memory device 30 of the second embodiment comprises a substrate 31, a first thermal adhesive pad 321, a second thermal adhesive pad 322, a first heat dissipation structure 331, a second heat dissipation structure 332 and a light guide element 34. The substrate 31 comprises a first lateral side 31a, a second lateral side 31b, a first substrate surface 31c, a second substrate surface 31d, a connection interface 311, plural light-emitting elements 312 and plural function modules 313. The connection interface 311 comprises a first connection part 3111 and a second connection part 3112 (see FIG. 3D). The first heat dissipation structure 331 comprises a first part 331a and a second part 331b. Similarly, the second heat dissipation structure 332 comprises a first part 332a and a second part 332b. The first parts 331a and 332a are attached on the substrate surfaces 31c and 31d, respectively. The second parts 331b and 332b are located near the second lateral side 31b of the substrate 31. In this embodiment, the second parts 331b and 332b comprise fin assemblies 3311 and 3321, respectively. The light guide element 34 further comprises a first locking part 3411, a second locking part 3421 and a positioning part 3422. Moreover, the first lateral side 31a and second lateral side 31b of the substrate 31 are arranged between the two substrate surfaces 31c and 31d.

Especially, the first connection part 3111 and the second connection part 3112 of the connection interface 311 are disposed on the first substrate surface 31c and a second substrate surface 31d, respectively. Moreover, the first connection part 3111 and the second connection part 3112 of the connection interface 311 are located near the first lateral side 31a and electrically connected with an electronic device (not shown). The two heat dissipation structures 331 and 332 are located near the two substrate surfaces 31c and 31d through the two thermal adhesive pads 331 and 322, respectively. The light guide element 34 is assembled with or locked on the two heat dissipation structures 331 and 332. Moreover, the light guide element 34 is located near the second lateral side 31b of the substrate 31.

Figure 3C:
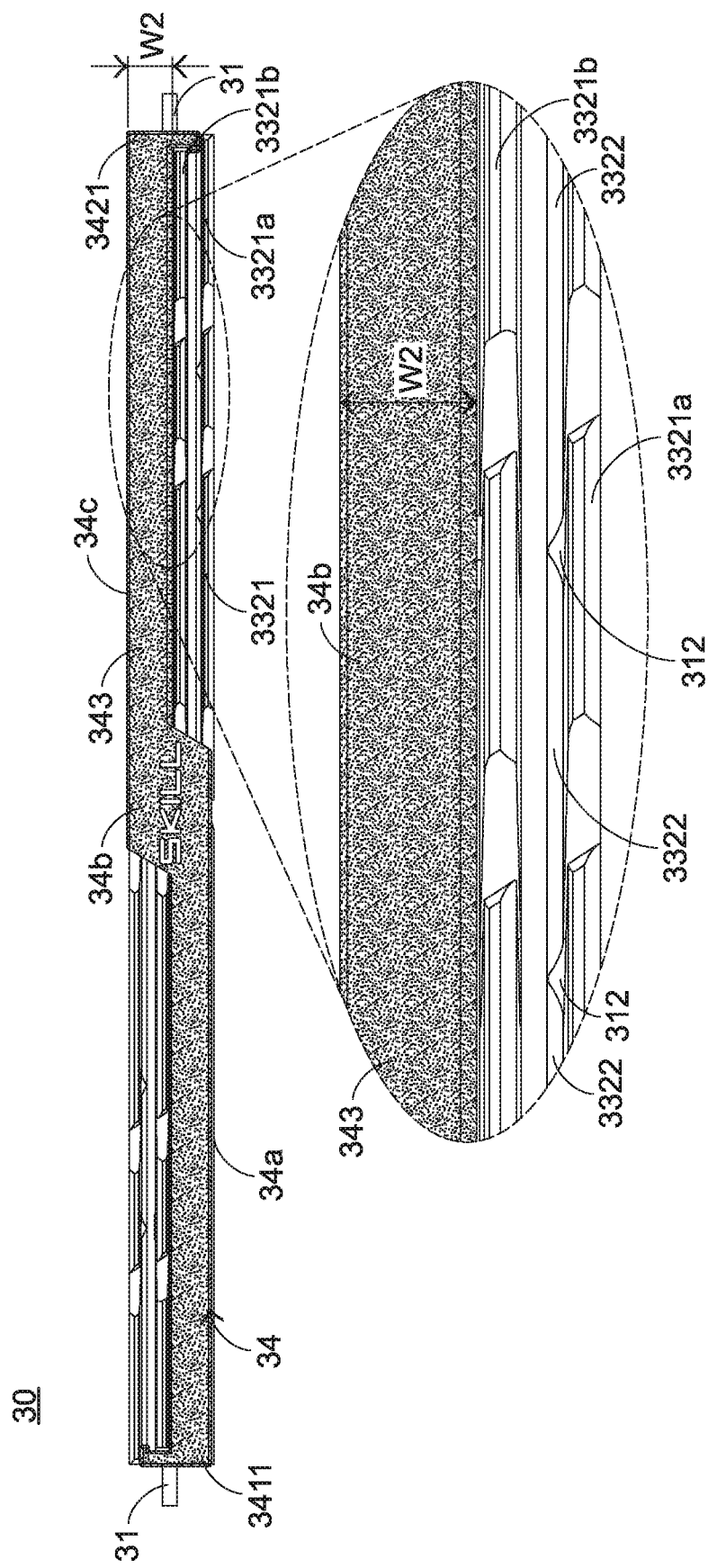
FIG. 3C is a schematic top view illustrating the memory device of FIG. 3A and taken along a viewpoint A.
Figure 3D:
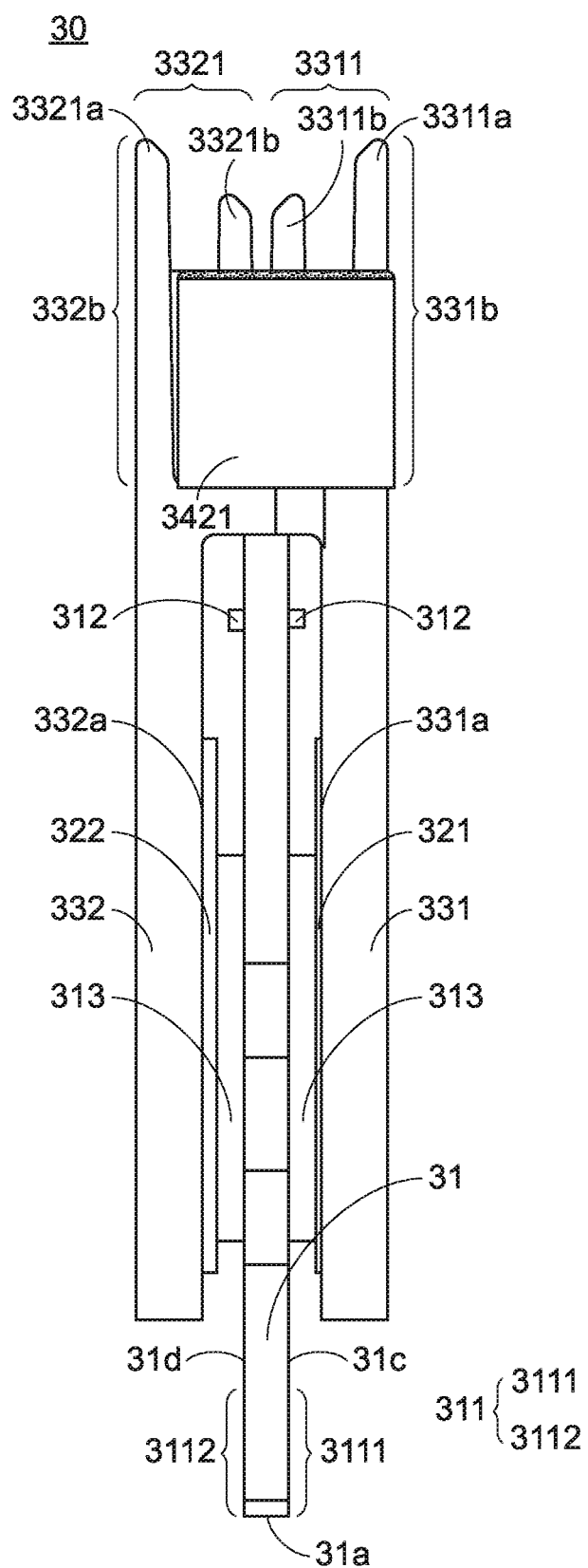
FIG. 3D is a schematic side view illustrating the memory device of FIG. 3A and taken along a viewpoint B.

FIG. 3C is a schematic top view illustrating the memory device of FIG. 3A and taken along a viewpoint A. FIG. 3D is a schematic side view illustrating the memory device of FIG. 3A and taken along a viewpoint B. Please refer to FIGS. 3C and 3D. In addition to the two locking parts 3411, 3421 and the positioning part 3422, the light guide element 34 further comprises three light guide surfaces 34a~34c. The light guide surface 34a is on a left side of the fin assembly 3311, the light guide surface 34b is disposed over the memory device 30, and the light guide surface 34c is on the right side of the fin assembly 3321. Moreover, there are plural seams 3322 between these fins 3321a and 3321b. After the light beams emitted by the light-emitting elements 312 pass through the seams 3322, the light beams are outputted along a refractive guiding path. Due to the seams 3322 or at least one channel (not shown), the light beams are transferred through the designed guiding path and centralized or distributed on the light guide element 34.

In comparison with the first embodiment, the fin assemblies and the light guide element of this embodiment are distinguished. As shown in FIGS. 3C and 3D, the number of fins in the fin assembly 3321 is different from that of the first embodiment. Moreover, as shown in FIGS. 3A-3D, the fin assembly 3321 of the second heat dissipation structure 332 comprises two fins 3321a and 3321b and the fin assembly 3311 of the first heat dissipation structure 331 comprises two fins 3311a and 3311b. That is, the fin number of each heat dissipation structure of this embodiment is two, but the fin number of each heat dissipation structure of the first embodiment is three. Similarly, due to the seams 3322 between the two fins 3321a and 3321b, the light beams are transferred through the designed guiding path and centralized or distributed on the three light guide surfaces 34a~34c.

Please refer to FIGS. 2C and 3C again. The corresponding structures of the fin assemblies 2321, 3321 and the light guide elements 24, 34 are shown in FIGS. 2C and 3C. The width W1 of the light guide surface 24b and the width W2 of the light guide surface 34b are determined according to the fin numbers of the fin assemblies 2321 and 3321. As mentioned above, the fin assembly 2321 of the first embodiment comprises three fins, and the fin assembly 3321 of this embodiment comprises two fins 3321a and 3321b. Consequently, the width W2 of the light guide surface 34b of the light guide element 34 is much larger than the width W1 of the light guide surface 24b of the light guide element 24. Since the width W2 of the light guide surface 34b is larger, the light-transmissible area of the light guide surface 34b of the light guide element 34 is much larger than that of the first embodiment. In other words, the area of the light guide surface may be varied according to the practical light-guiding requirement of the product.

Figure 3E:
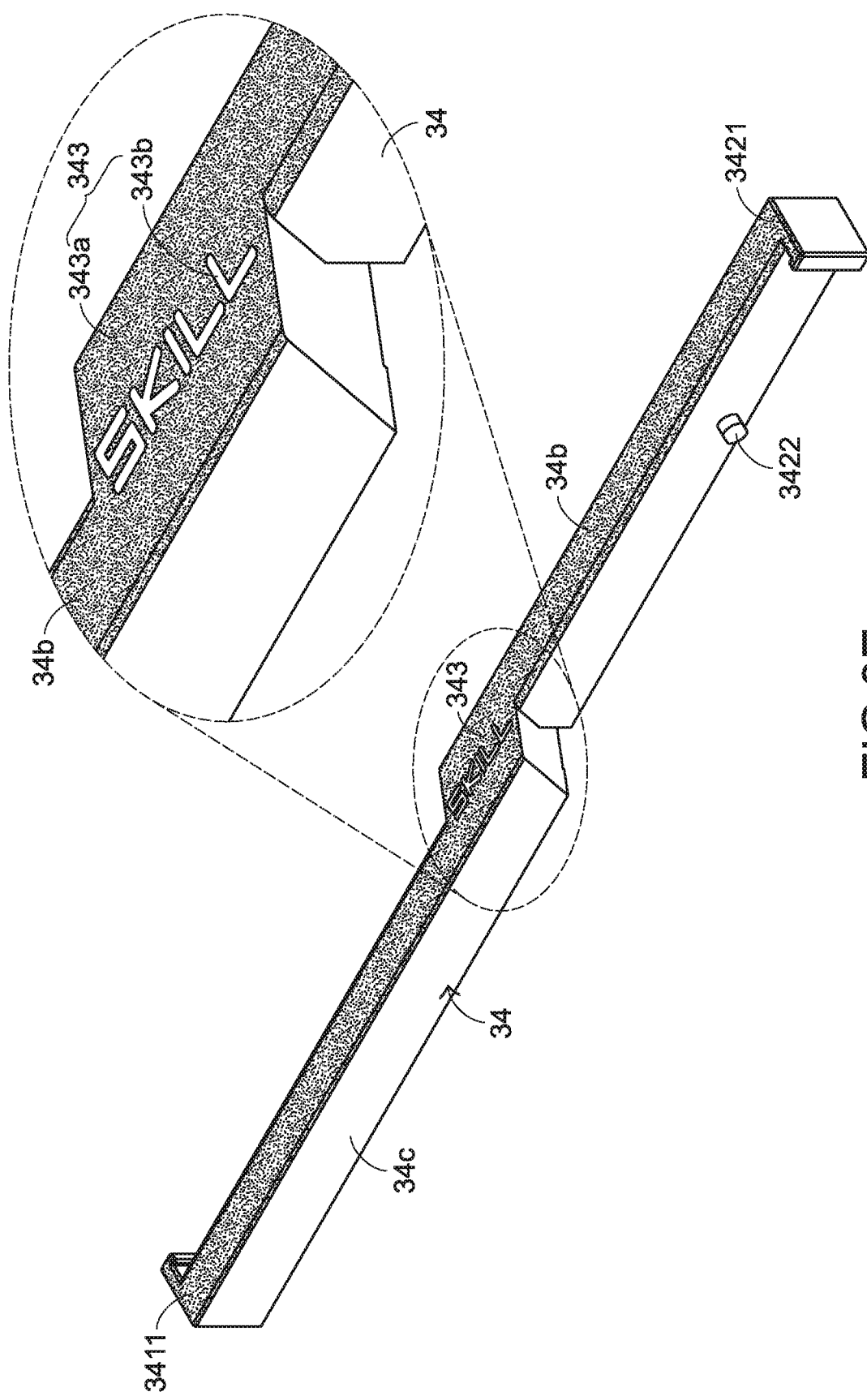
FIG. 3E is a schematic perspective view illustrating the light guide element of the memory device of FIG. 3A.

FIG. 3E is a schematic perspective view illustrating the light guide element of the memory device of FIG. 3A. As shown in FIG. 3E, the light guide surface 34b of the light guide element 34 further comprises a light-shading layer 34. The light-shading layer 34 comprises a shading region 343a and a non-shading region 343b. The light beams are blocked from passing through the shading region 343a. Consequently, the light beams are centralized or distributed on the non-shading region 343b. In this embodiment, the non-shading region 343b is a LOGO region with a character mark "SKILL". Since the light beams from the light-emitting elements 312 are centralized or distributed on the character mark "SKILL", the character mark "SKILL" exhibits different lighting effect in response to the light color or the material of the light guide element 34. Consequently, the user can view the character mark "SKILL" more clearly.

From the above descriptions, the positions of centralizing or distributing the light beams on the light guide element can be determined according to the diversified design of the light-shading layer 34. Moreover, the intensity of the light beams from the light guide element 34 can be adjusted according to the transmittance and color of the material of the light guide element 34.

Figure 4A:
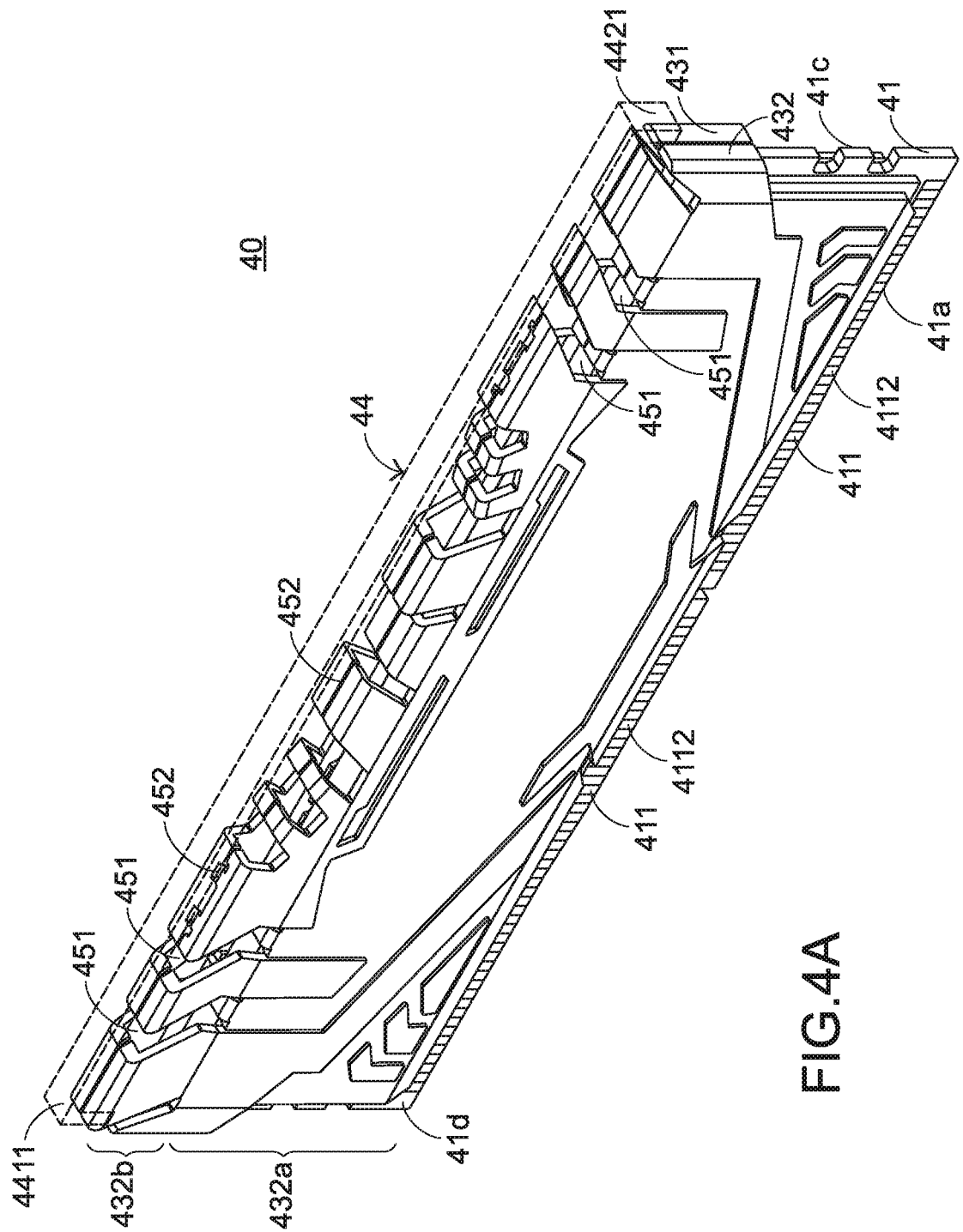
FIG. 4A is a schematic perspective view illustrating a memory device according to a third embodiment of the present invention.
Figure 4B:
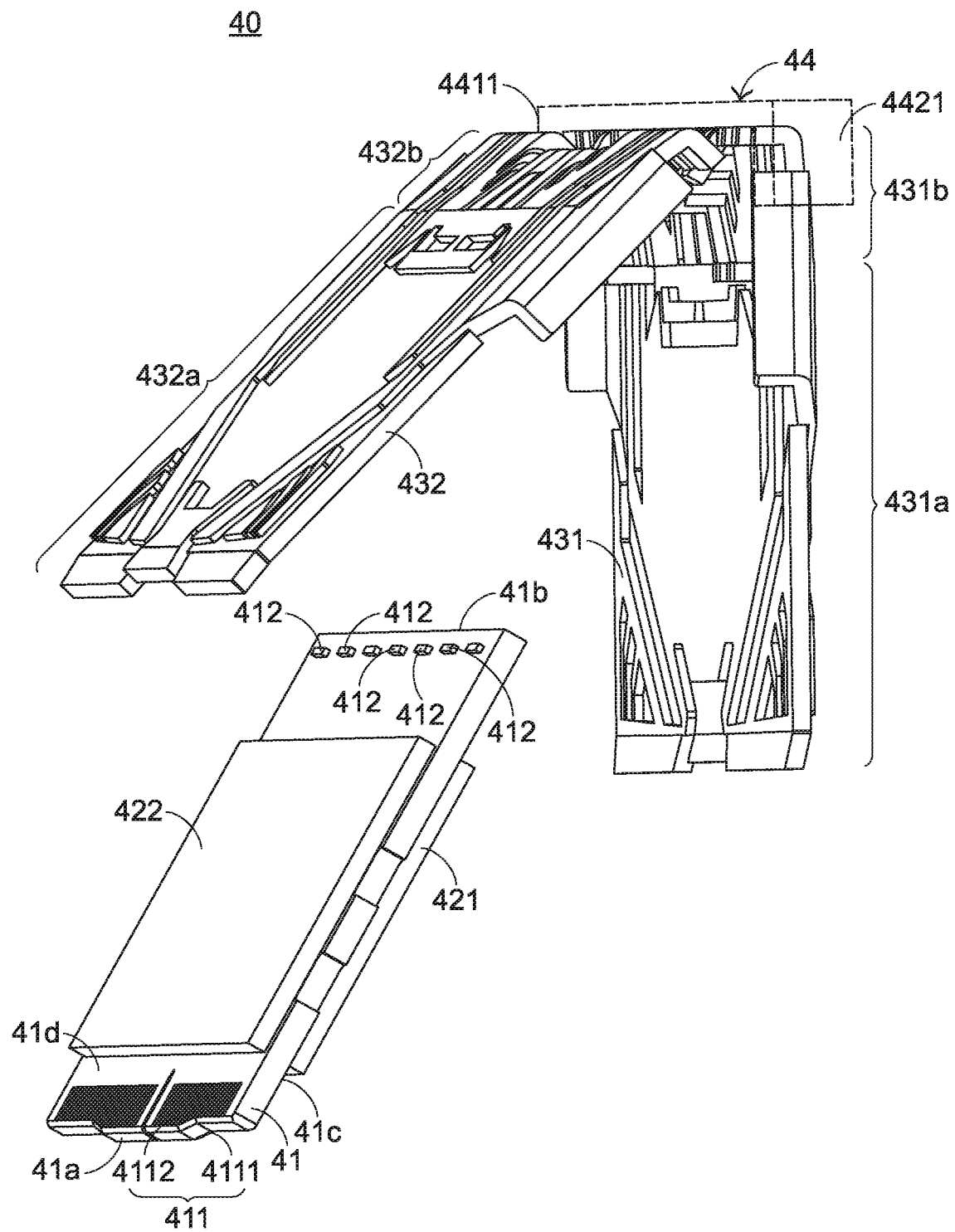
FIG. 4B is a schematic exploded view illustrating the memory device of FIG. 4A.

FIG. 4A is a schematic perspective view illustrating a memory device according to a third embodiment of the present invention. FIG. 4B is a schematic exploded view illustrating the memory device of FIG. 4A.

In this embodiment, the memory device 40 is a clamp-type memory device. In this embodiment, the memory device 40 comprises a substrate 41, a first thermal adhesive pad 421, a second thermal adhesive pad 422, a first heat dissipation structure 431, a second heat dissipation structure 432 and a light guide element 44. The substrate 41 comprises a first lateral side 41a, a second lateral side 41b, a first substrate surface 41c, a second substrate surface 41d, a connection interface 411, plural light-emitting elements 412 and plural function modules (not shown). The connection interface 411 comprises a first connection part 4111 and a second connection part 4112 (see FIG. 4B). The first lateral side 41a and the second lateral side 41b are arranged between the two substrate surfaces 41c and 41d. The first heat dissipation structure 431 comprises a first part 431a and a second part 431b. Similarly, the second heat dissipation structure 432 comprises a first part 432a and a second part 432b. The first parts 431a and 432a are attached on the substrate surfaces 41c and 41d, respectively. The second parts 431b and 432b are located near the second lateral side 41b of the substrate 41.

Especially, the first connection part 4111 and the second connection part 4112 of the connection interface 411 are disposed on the first substrate surface 41c and the second substrate surface 41d, respectively. Moreover, the first connection part 4111 and the second connection part 4112 of the connection interface 411 are located near the first lateral side 41a and electrically connected with an electronic device (not shown). The two heat dissipation structures 431 and 432 are located near the two substrate surfaces 41c and 41d through the two thermal adhesive pads 421 and 422, respectively. The light guide element 44 is assembled with or locked on any one or two of the heat dissipation structures 431 and 432. In this embodiment, the light guide element 44 is assembled with or locked on the heat dissipation structure 432. Moreover, the light guide element 34 is located near the second lateral side 41b of the substrate 41.

Moreover, each of the two second parts 431b and 432b of the heat dissipation structures 431 and 432 comprises plural seams 451. After the two second parts 431b and 432b are combined together, at least one channel 452 is defined. The light guide element 44 further comprises a first locking part 4411 and a second locking part 4421. After the light beams generated by the plural light-emitting elements 412 pass through the at least one channel 452, the light beams are centralized or distributed on the light guide element 44. The channel 452 is a gap that is created when the substrate 41 is clamped between and partially connected with the two heat dissipation structures 431 and 432.

In this embodiment, the two heat dissipation structures 431 and 432 are not equipped with fin assemblies. Especially, in this embodiment, the seams 451 of the two second parts 431b and 432b and the two locking parts 4411 and 4421. Consequently, the light guide element 44 and the heat dissipation structures 431 and 432 can be assembled or disassembled and replaced with new ones according to the practical applications and requirements of the product.

Figure 5A:
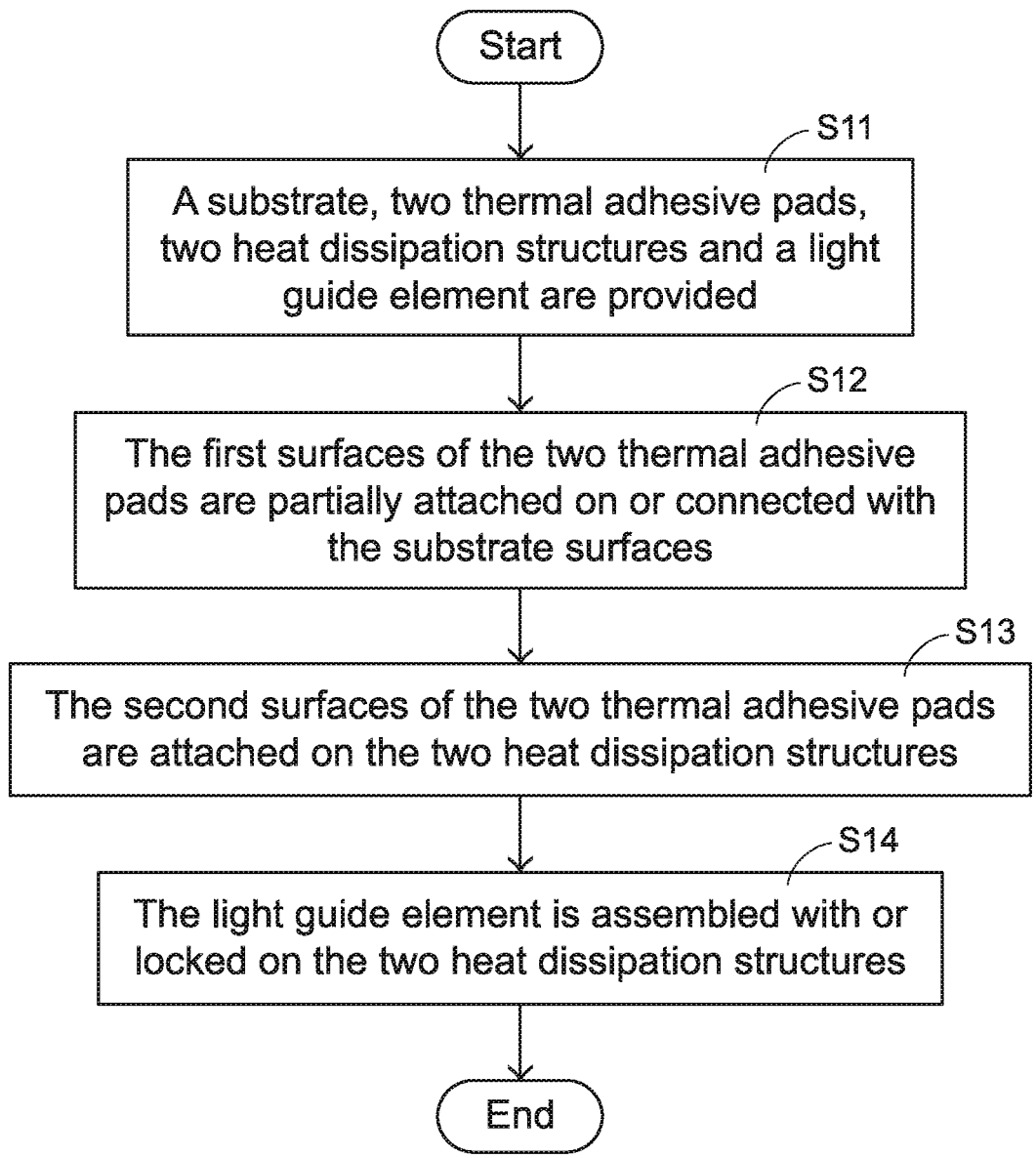
FIG. 5A is a flowchart illustrating an exemplary method for assembling the memory device of the second embodiment.

Two examples of the method for assembling the memory device of the present invention will be described with reference to FIGS. 5A and 5B. FIG. 5A is a flowchart illustrating an exemplary method for assembling the memory device of the second embodiment as shown in FIGS. 3A and 3B. The method comprises at least the following steps. In a step S11, a substrate 31, a first thermal adhesive pad 321, a second thermal adhesive pad 322, a first heat dissipation structure 331, a second heat dissipation structure 332 and a light guide element 34 are provided. In a step S12, first surfaces of the two thermal adhesive pads 321 and 322 are partially attached on or connected with the substrate surfaces 31c and 31d of the substrate 31. In a step S13, second surfaces of the two thermal adhesive pads 321 and 322 are attached on the two heat dissipation structures 331 and 332. In a step S14, the light guide element 34 is assembled with or locked on the two heat dissipation structures 331 and 332. Consequently, the light guide element 34 is located near the second lateral side 31b of the substrate 31.

In the step S11, the first heat dissipation structure 331 is partially attached on or connected with the first substrate surface 31c through the first thermal adhesive pad 321, and the second heat dissipation structure 332 is partially attached on or connected with the second substrate surface 31d through the second thermal adhesive pad 322. As mentioned above, the first heat dissipation structure 331 comprises the first part 331a and the second part 332a, and the second heat dissipation structure 332 comprises the first part 331b and the second part 332b. That is, the first parts 331a and 332a are partially attached on the first substrate surface 31c and the second substrate surface 31d through the first thermal adhesive pad 321 and the second thermal adhesive pad 322, respectively. For example, the first parts 331 and 332 are attached on the control module and the storage modules. The second parts 331b and 332b are located near the second lateral side 31b of the second substrate 31.

In other words, the substrate surfaces 31c and 31d of the substrate 31 are clamped and partially attached by the first parts 331a and 332a of the two heat dissipation structures 331 and 332 through the two thermal adhesive pads 321 and 322. Then, the light guide element 34 is assembled with or locked on the second parts 331b and 332b of the two heat dissipation structures 331 and 332. Since the light guide element 34 is assembled with or locked on the second parts 331b and 332b, the light guide element 34 is also located near the second lateral side 31b of the second substrate 31.

Figure 5B:
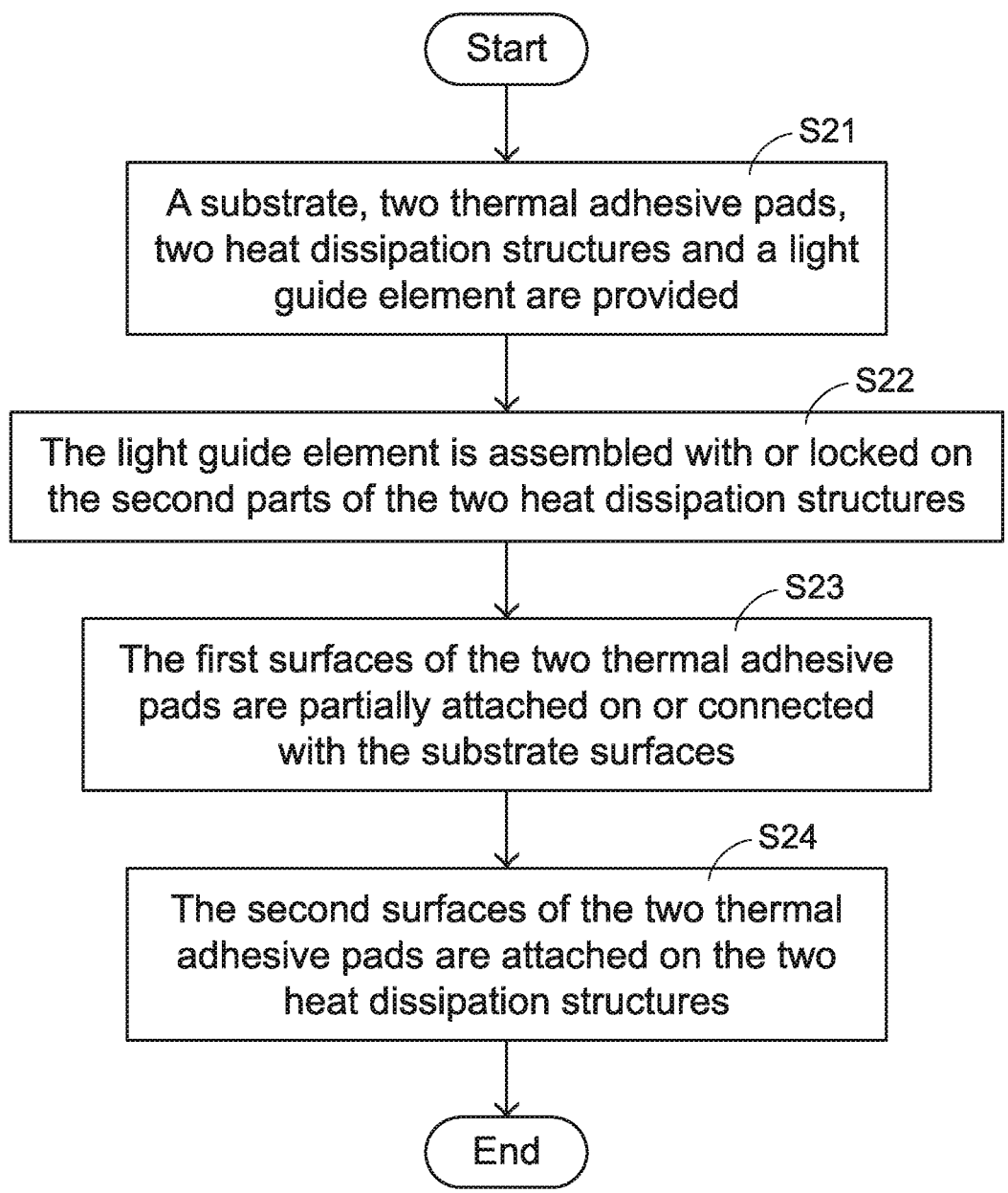
FIG. 5B is a flowchart illustrating another exemplary method for assembling the memory device of the third embodiment.

FIG. 5B is a flowchart illustrating another exemplary method for assembling the memory device of the third embodiment as shown in FIGS. 4A and 4B. The method comprises at least the following steps. In a step S21, a substrate 41, a first thermal adhesive pad 421, a second thermal adhesive pad 422, a first heat dissipation structure 431, a second heat dissipation structure 432 and a light guide element 44 are provided. In a step S22, the light guide element 44 is assembled with or locked on the second parts 431b and 432b of the two heat dissipation structures 431 and 432. In a step S23, first surfaces of the two thermal adhesive pads 421 and 422 are partially attached on or connected with the substrate surfaces 41c and 41d of the substrate 41. In a step S24, second surfaces of the two thermal adhesive pads 421 and 422 are attached on the two heat dissipation structures 431 and 432. Consequently, the light guide element 44 is located near the second lateral side 41b of the substrate 41.

In the step S22, the light guide element 44 is assembled with or locked on the second parts 431b and 432b of the two heat dissipation structures 431 and 432. After the step S22, the steps S23 and S24 are sequentially performed. That is, the first parts 431a and 432a of the two heat dissipation structures 431 and 432 are partially attached on or connected with the substrate surfaces 41c and 41d of the substrate 41 through the two thermal adhesive pads 421 and 422, respectively. Afterwards, the two heat dissipation structures 431 and 432, the two thermal adhesive pads 421 and 422 and the substrate 41 are combined together, and the light guide element 44 is located near the second lateral side 41b of the substrate 41.

In other words, the light guide element 44 is firstly assembled with or locked on the second parts 431b and 432b of the two heat dissipation structures 431 and 432. Then, the substrate surfaces 41c and 41d of the substrate 41 are clamped and partially attached by the first parts 431a and 432a of the two heat dissipation structures 431 and 432 through the two thermal adhesive pads 421 and 422.

Figure 1A:
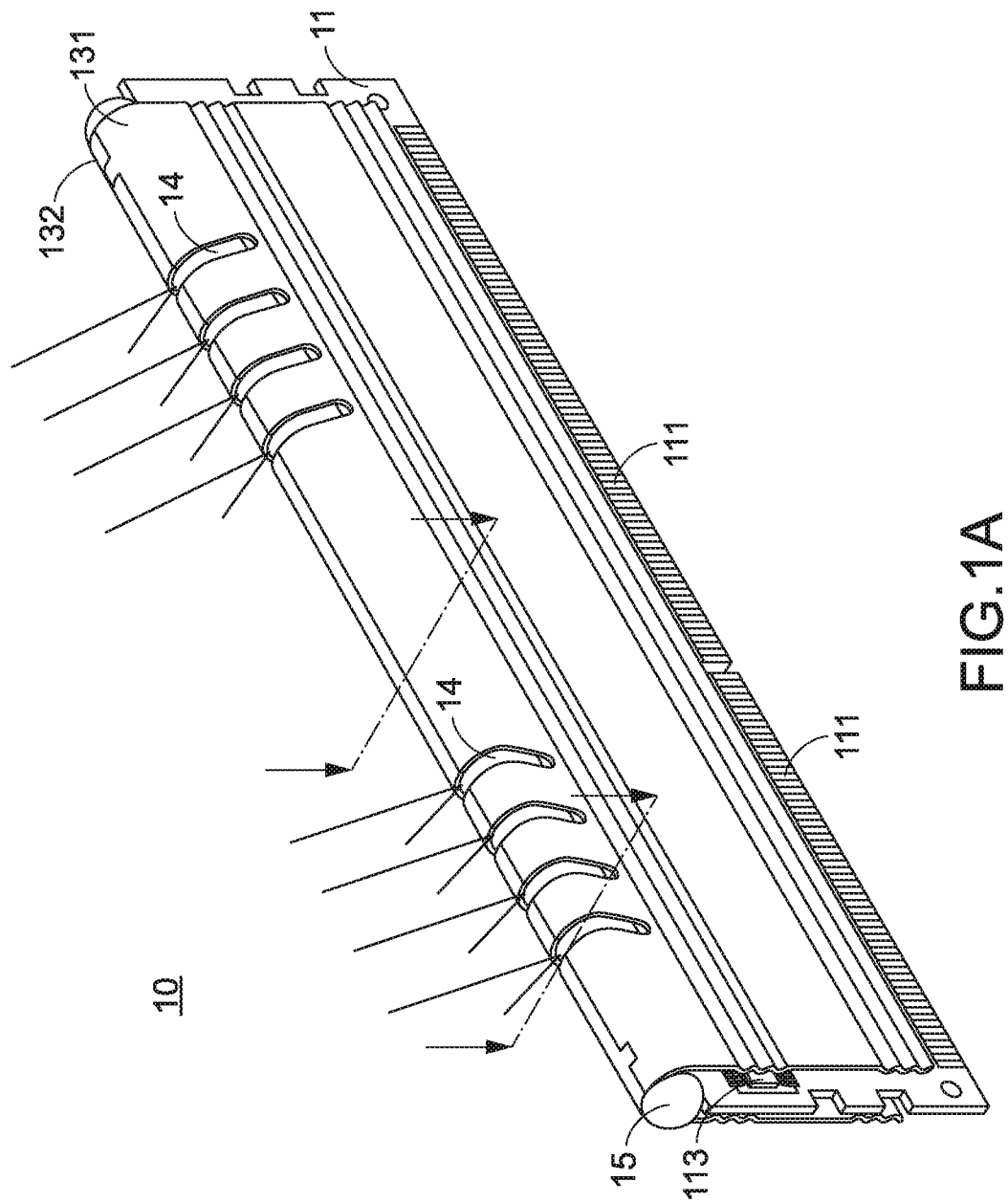
FIG. 1A is a schematic perspective view illustrating a conventional memory device.
Figure 1B:
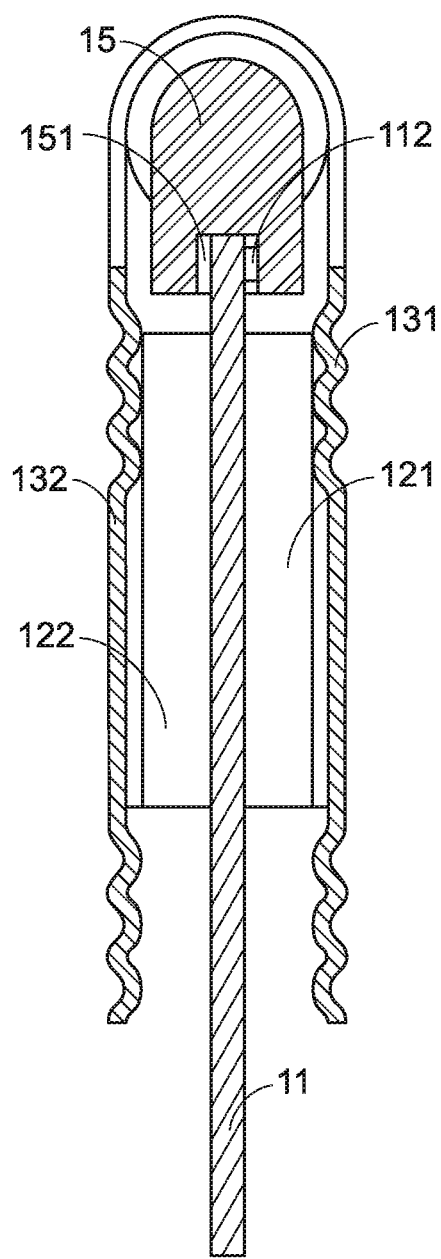
FIG. 1B is a schematic side cross-sectional view of the conventional memory device of FIG. 1A.

As previously described in FIGS. 1A and 1B, the conventional memory device has some drawbacks. For example, the heat generated by the light emitting diodes 112 cannot be dissipated away easily, and the guiding path of the light emitting diodes 112 is restricted by the heat dissipation structure 131. From the above discussions, it is found that the memory device of the present invention can effectively overcome the drawbacks of the conventional technology. In the above exemplary methods for assembling the memory device of the present invention, the heat dissipation structures are combined with the substrate and the heat dissipation structures are combined with the light guide element. According to the assembling method and the structure of the memory device of the present invention, the heat dissipation structure can increase the heat dissipating performance of the substrate. Moreover, since the light guide element is assembled with or locked on the heat dissipation structure, the light guide element may be modified according to the practical requirements. Consequently, the flexibility and convenience of freely replacing the light guide element are enhanced.

Moreover, the two exemplary assembling methods of the present invention can be applied to the memory devices of the above embodiments. In accordance with the feature of the present invention, the light guide element is locked on or assembled with the second parts of the two heat dissipation structures, and then the first parts of the two heat dissipation structures are partially attached on or connected with the two substrate surfaces through the two thermal adhesive pads. Consequently, the light guide element is located near the second lateral side of the substrate. It is noted that numerous modifications and alterations may be made while retaining the teachings of the invention In accordance with the concepts of the present invention, the light guide element is locked on or assembled with the second parts of the heat dissipation structures and the first parts of the heat dissipation structures are partially attached on or connected with the substrate surfaces. Moreover, the second parts of the heat dissipation structures are equipped with the fin assemblies in order to increase the heat transfer efficiency and the heat dissipating performance. Alternatively, plural seams are formed in the second parts of the heat dissipation structures. After the light beams from the light-emitting elements pass through the seams, the light beams are transferred along at least one guiding path and refracted by the light guide element. Consequently, the light guide element exhibits a lighting effect. Alternatively, the guiding path and the light distribution are adjustable according to the light-shading layer.

Unlike the conventional technology, the light-emitting elements are not covered by the light guide element according to the technology of the present invention. Consequently, the working temperature of the light-emitting elements will not be obviously increased. Moreover, the light guide element can be freely assembled with or disassembled from the heat dissipation structures according to the profiles of the heat dissipation structures. Moreover, the appearance and material of the light guide element may be designed according to the practical requirements.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:
1. A memory device, comprising:
 a substrate comprising a first substrate surface, a second substrate surface opposite to the first substrate surface, and a first lateral side and a second lateral side, which are connected between the first substrate surface and the second substrate surface and opposite to each other, and further comprising:
 a storage module;
 plural light-emitting elements disposed on at least one of the first substrate surface and the second substrate surface; and
 a connection interface comprising a first connection part and a second connection part respectively disposed on the first substrate surface and the second substrate surface and located near the first lateral side to be electrically connected with an electronic device;

a heat dissipation structure partially connected with the substrate and partially separated from the substrate with at least one channel; and a light guide element directly assembled with or directly locked on the heat dissipation structure, so that the light guide element is directly in contact with the heat dissipation structure, wherein the light guide element is located near and fully disposed over the second lateral side of the substrate, and separated from the plural light-emitting elements with the heat dissipation structure, and after light beams generated by the plural light-emitting elements pass through the at least one channel, the light beams are centralized or distributed on the light guide element.

2. The memory device according to claim 1, wherein the heat dissipation structure comprises a first part and a second part, wherein the first part is attached on the substrate, the second part is located near the second lateral side of the substrate, and the light guide element is directly assembled with or directly locked on the second part.

3. The memory device according to claim 2, wherein the second part further comprises a fin assembly and at least one position-limiting recess, wherein the fin assembly comprises plural fins, the plural fins are arranged side by side, and the at least one position-limiting recess is defined by outer rims of the plural fins, wherein the light guide element further comprises a locking part and at least one positioning part corresponding to the fin assembly and the at least one position-limiting recess, and the at least one positioning part is limited within the at least one position-limiting recess, wherein the locking part is directly assembled with the second part of the heat dissipation structure, or the locking part is fixed between the plural fins.

4. The memory device according to claim 3, wherein there are plural seams between the plural fins, and the plural light beams from the substrate are centralized or distributed on the light guide element through the plural seams, wherein the light guide element generates at least one lighting effect according to locations of the plural seams.

5. The memory device according to claim 1, wherein the light guide element further comprises plural light guide surfaces, and at least one of the plural light guide surfaces comprises a light-shading layer, wherein the light-shading layer comprises a shading region, and the plural light beams are blocked from passing through the shading region, wherein the light-shading layer further comprises a non-shading region, and the plural light beams are centralized or distributed on the non-shading region.

6. The memory device according to claim 1, wherein the memory device further comprises a thermal adhesive pad, and the heat dissipation structure is partially attached on the substrate through the thermal adhesive pad.

7. The memory device according to claim 1, wherein the plural light-emitting elements are RGB LEDs, which are controlled by an application program.

8. The memory device according to claim 7, wherein the application program is loaded into a control module of the substrate and/or a host that is electrically connected with the memory device, so that the RGB LEDs produce monochromatic or polychromatic lighting effects.

* * * * *